United States Patent
Letavic et al.

(10) Patent No.: US 7,968,938 B2
(45) Date of Patent: Jun. 28, 2011

(54) HIGH-VOLTAGE DEVICE STRUCTURE

(75) Inventors: Theodore Letavic, Putnam Valley, NY (US); John Petruzzello, Carmel, NY (US)

(73) Assignee: NXP B.V., Eindhoven (NL)

( * ) Notice: Subject to any disclaimer, the term of this patent is extended or adjusted under 35 U.S.C. 154(b) by 455 days.

(21) Appl. No.: 11/629,766

(22) PCT Filed: Jun. 10, 2005

(86) PCT No.: PCT/IB2005/051930
§ 371 (c)(1),
(2), (4) Date: Nov. 7, 2007

(87) PCT Pub. No.: WO2005/124873
PCT Pub. Date: Dec. 29, 2005

(65) Prior Publication Data
US 2008/0128743 A1    Jun. 5, 2008

(51) Int. Cl.
*H01L 29/94* (2006.01)
(52) U.S. Cl. . 257/330; 257/328; 257/329; 257/E29.256; 257/E29.118
(58) Field of Classification Search .................. 257/328, 257/330, 329, E29.118, 262, E29.256
See application file for complete search history.

(56) References Cited

U.S. PATENT DOCUMENTS

| | | | |
|---|---|---|---|
| 6,133,591 | A | 10/2000 | Letavic et al. |
| 6,191,447 | B1 | 2/2001 | Baliga |
| 6,191,453 | B1 | 2/2001 | Petruzzello et al. |
| 6,310,378 | B1 | 10/2001 | Letavic et al. |
| 2002/0056883 | A1 | 5/2002 | Baliga |
| 2002/0056884 | A1* | 5/2002 | Baliga .......................... 257/492 |
| 2005/0133858 | A1* | 6/2005 | Banerjee et al. .............. 257/327 |

* cited by examiner

*Primary Examiner* — Samuel A Gebremariam

(57) ABSTRACT

The present invention provides a vertical tapered dielectric high-voltage device (10) in which the device drift region is depicted by action of MOS field plates (30) formed in vertical trenches. The high-voltage device comprises: a substrate (32); a silicon mesa (20) formed on the substrate and having a stripe geometry, wherein the silicon mesa provides a drift region having a constant doping profile; a recessed gate (22) and source (SN) formed on the silicon mesa; a trench (26) adjacent each side of the silicon mesa; and a metal-dielectric field plate structure (12) formed in each trench; wherein each metal-dielectric field plate structure comprises a dielectric (28) and a metal field plate (30) formed over the dielectric, and wherein a thickness of the dielectric increases linearly through a depth of the trench to provide a constant longitudinal electric field.

20 Claims, 5 Drawing Sheets

HIGH-VOLTAGE DEVICE STRUCTURE

The present invention relates in general to semiconductor devices. More particularly, the present invention is directed to the formation of vertically-oriented, high-voltage devices in which the device drift region is depleted by action of MOS field plates formed in vertical trenches. Such devices may include, for example, double-diffused metal oxide semiconductors (DMOS) and insulated gate bipolar transistors (IGBT).

In fabricating high-voltage power devices, tradeoffs and compromises must typically be made in areas such as breakdown voltage, size, on-resistance, saturation current, and manufacturing simplicity and reliability. Frequently, improving one parameter, such as breakdown voltage, will result in the degradation of another parameter, such as on-resistance. Ideally, such devices would feature superior characteristics in all areas, with a minimum of operational and fabrication drawbacks.

Numerous lateral high-voltage semiconductor devices with low on-resistance have been developed. For example, U.S. Pat. Nos. 6,133,591, 6,191,453, and 6,310,378, incorporated herein by reference, describe state of the art silicon-on-oxide (SOI) high voltage lateral insulated-gate bipolar transistors (LIGBT) and lateral DMOS (LDMOS) transistors. Although these devices have the lowest specific on-resistance versus breakdown voltage for lateral high-voltage device structures used in switching mode power supply applications, there is still an unsatisfied need for high-voltage devices that can support still higher voltages while achieving much lower on-resistance.

The present invention provides a vertical tapered dielectric high-voltage device in which the device drift region is depleted by action of MOS field plates formed in vertical trenches. The structure can be viewed as stripes of semiconductor and dielectric field plate structures which are built into the depth of a semiconductor wafer. The semiconductor drift region has a constant doping profile and the dielectric layer thickness is non-uniform (e.g., tapered) through the depth of the trench to achieve a constant longitudinal electric field. The substrate can be n-type or p-type, resulting in the fabrication of DMOS or IGBT devices, respectively. Recombination of minority carriers at the stripe interface of semiconductor and dielectric results in fast switching IGBT characteristics. Device layout as viewed from the surface of the semiconductor is a stripe geometry of source and gate connections.

This device structure shows a factor-of-five reduction in specific on-resistance with respect to an ideal lateral high-voltage device SOCOS, such as that disclosed in U.S. Pat. No. 6,310,378. The supporting substrate can be n-type or p-type, which can be thinned to reduce parasitic resistance (e.g., for DMOS) and to form an injecting contact (e.g., for IGBT). The IGBT version shows at least a factor-of-two improvement in specific on-resistance and maximum current capability over the vertical tapered dielectric version of the present invention, bringing the total performance improvement with respect to lateral SOCOS to one order-of-magnitude.

The high-voltage device of the present invention may be provided by etching trench stripes into a semiconductor substrate which has doping set by controlled epitaxy or a fixed doping level. For an IGBT, a p-type substrate with n-type epitaxial layer is used. Trench stripe etch is followed by formation of depleting structures by deposition or shaping of dielectric and metallic layers along the sidewalls of the trench. The dielectric layer can be silicon dioxide or any low-k dielectric. A recessed gate structure is used for channel formation of the vertical transistor for improved gate transconductance.

In a first aspect, the present invention provides a high-voltage device, comprising: a substrate; a silicon mesa formed on the substrate, wherein the silicon mesa provides a drift region having a constant doping profile; a recessed gate and source formed on the silicon mesa; a trench adjacent each side of the silicon mesa; and a metal-dielectric field plate structure formed in each trench; wherein each metal-dielectric field plate structure comprises a dielectric and a metal field plate formed over the dielectric, and wherein a thickness of the dielectric increases linearly through a depth of the trench to provide a constant longitudinal electric field.

In a second aspect, the present invention provides a high-voltage device, comprising: a substrate; a silicon stripe formed on the substrate; a silicon mesa formed in the silicon stripe, wherein the silicon mesa provides a drift region having a constant doping profile; a recessed gate and source formed on the silicon mesa; a trench adjacent each side of the silicon stripe; and a metal-dielectric field plate structure formed in each trench along the silicon stripe; wherein each metal-dielectric field plate structure comprises a dielectric and a metal field plate formed over the dielectric, and wherein a thickness of the dielectric increases linearly through a depth of the trench to provide a constant longitudinal electric field.

In a third aspect, the present invention provides a method for forming a high voltage device, comprising: forming a silicon stripe on a substrate; forming a silicon mesa in the silicon stripe, wherein the silicon mesa provides a drift region having a constant doping profile; forming a recessed gate and source on the silicon mesa; forming a trench adjacent each side of the silicon stripe; and forming a metal-dielectric field plate structure in each trench along the silicon stripe; wherein each metal-dielectric field plate structure comprises a dielectric and a metal field plate formed over the dielectric, and wherein a thickness of the dielectric increases linearly through a depth of the trench to provide a constant longitudinal electric field.

These and other features of this invention will be more readily understood from the following detailed description of the various aspects of the invention taken in conjunction with the accompanying drawings in which.

It should be noted that the drawings are merely schematic representations, not intended to portray specific parameters of the invention. The drawings are intended to depict only typical aspects of the invention, and therefore should not be considered as limiting the scope of the invention.

Figure 1:
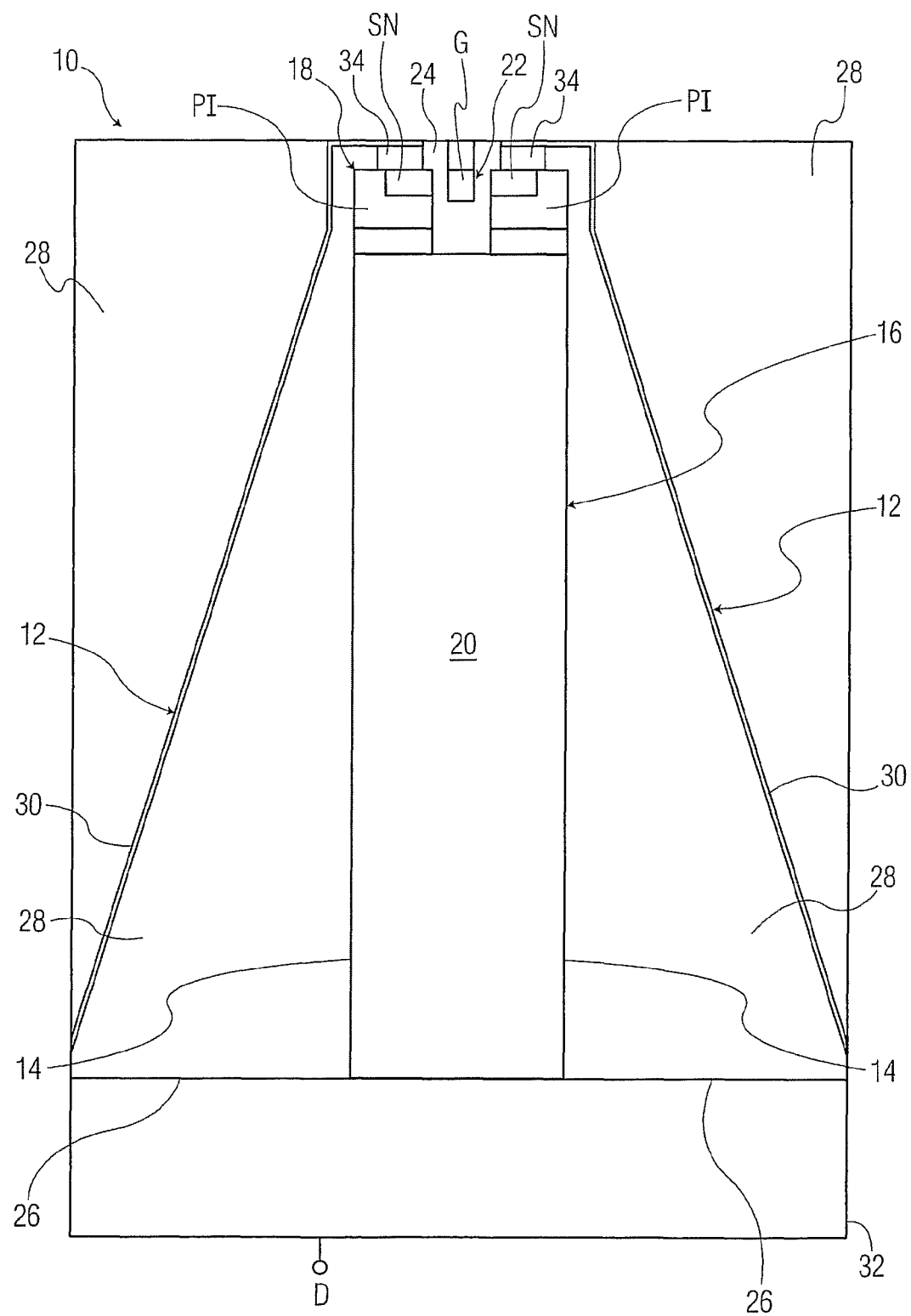
FIG. 1 is a cross-sectional view of a recessed gate n-channel DMOS device produced in accordance with an embodiment of the present invention.

Referring to FIG. 1, there is illustrated a cross-sectional view of a recessed gate, tapered dielectric, n-channel DMOS device 10 produced in accordance with an embodiment of the present invention. The device 10 is a vertical high-voltage device which supports voltage by depletion from metal-dielectric field plate structures 12 formed along the sidewalls 14 of a trench stripe 16 etched in a silicon wafer. A corresponding IGBT device can be formed by using a p-type substrate in lieu of the n-type substrate illustrated in FIG. 1, and by providing an n-type epitaxial layer over the p-type substrate.

The trench stripe 16 is produced in the silicon wafer using standard trench etching techniques. The surface of the silicon wafer is at the gate/source planar surface 18. A silicon mesa 20 is formed in the trench stripe 16. The silicon mesa 20 can be silicon substrate or an n-type epitaxial layer, has a constant doping profile, and forms the drift region of the device 10. A source (SN), p-inversion (PI) layer, and a recessed-gate structure 22 comprising a recessed polysilicon gate region (G) surrounded by gate oxide 24, are formed on the silicon mesa. A drain electrode D may be applied in a known manner to the substrate 32. The recessed-gate structure 22, source (SN) and p-inversion (PI) layer are produced using well known techniques and will not be described in further detail. The metal-dielectric field plate structures 12 are formed in the trenches 26 adjacent the trench stripe 16/silicon mesa 20.

Each metal-dielectric field plate structure 12 comprises a dielectric 28 and a metal field plate 30. The dielectric 28 may comprise, for example, silicon dioxide or any low-k dielectric. As shown in FIG. 1, the thickness of the dielectric 28 between the metal field plate 30 and the silicon mesa 20 increases linearly through the depth of the trench 26 toward the substrate 32. The metal field plate 30 is shorted to the source (SN) of the device 10 by contacts 34 for optimal switching characteristics.

The variation of dielectric 28 layer thickness with position is given by:

$$t_{ox}(x) = ((E_x \epsilon_0 \epsilon_{ox})/(q N_d t_{soi}))x + c \qquad \text{EQU. 1}$$

where $E_X$ is the longitudinal electric field, $\epsilon_0$ is the permittivity of free space, $\epsilon_{ox}$ is the permittivity of the dielectric 28, q is the magnitude of the electronic charge ($1.6 \times 10^{-19}$ coul), $N_d$ is the doping concentration within the drift region (silicon mesa 20), $t_{soi}$ is the thickness of the drift region (silicon mesa 20), and c is a constant than handles the gate oxide-field plate transition.

The metal-dielectric field plate structures 12 may be produced, for example, by forming a layer of a dielectric 28 in the trenches 26, shaping the dielectric 28 such that the thickness of the dielectric 28 increases linearly through the depth of the trench 26, and depositing metal field plates 30 over the shaped dielectric 28. Each of these steps can be performed using any now known or later developed processes. The area above the metal field plates 30 in the trenches 26 can then be filled with a dielectric (FIGS. 1 and 3) or metal/conductor (FIG. 2), and planarized.

Figure 2:
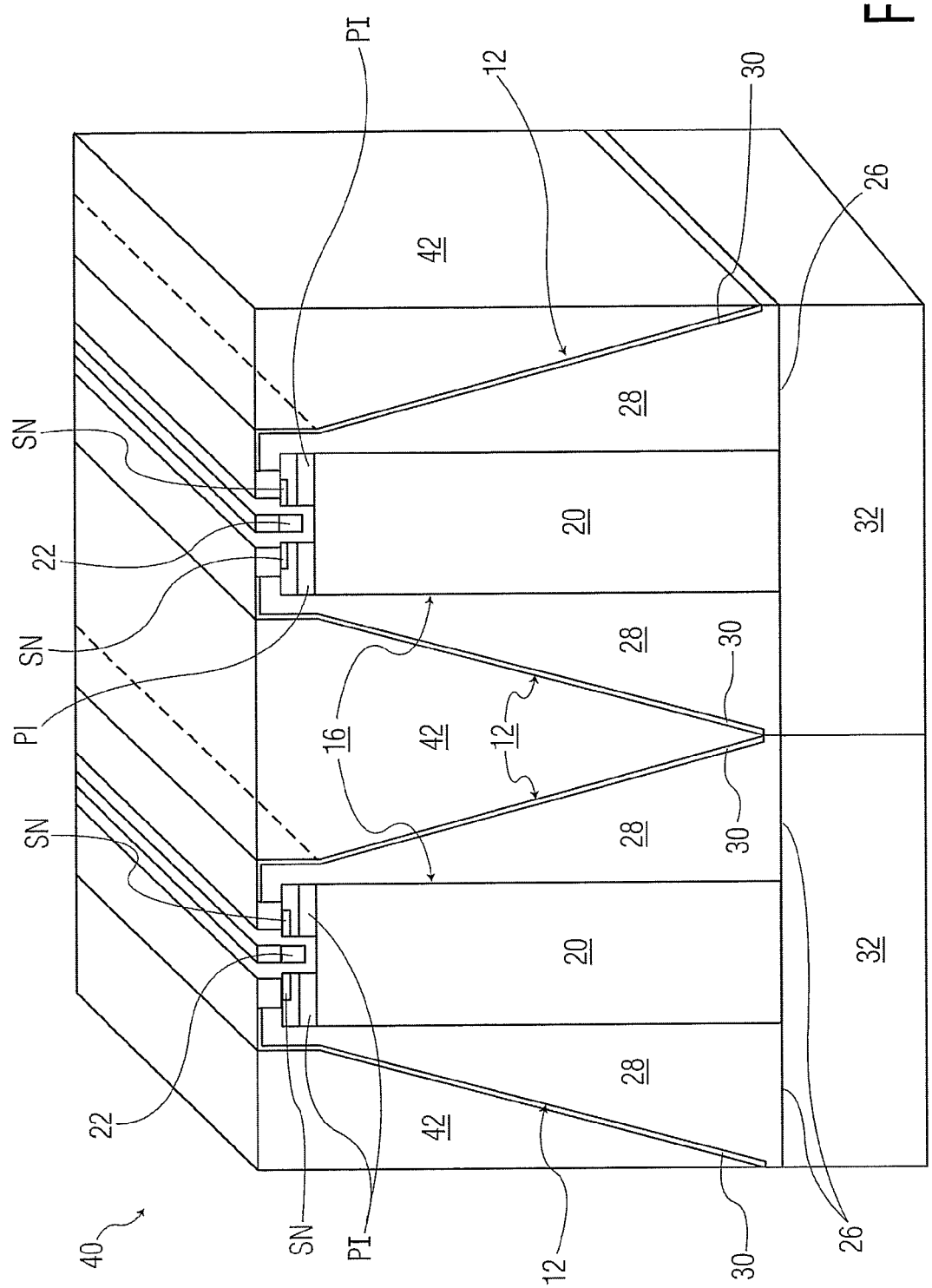
FIG. 2 is a three-dimensional cross-sectional view of the device of FIG. 1 according to an embodiment of the present invention.
Figure 3:
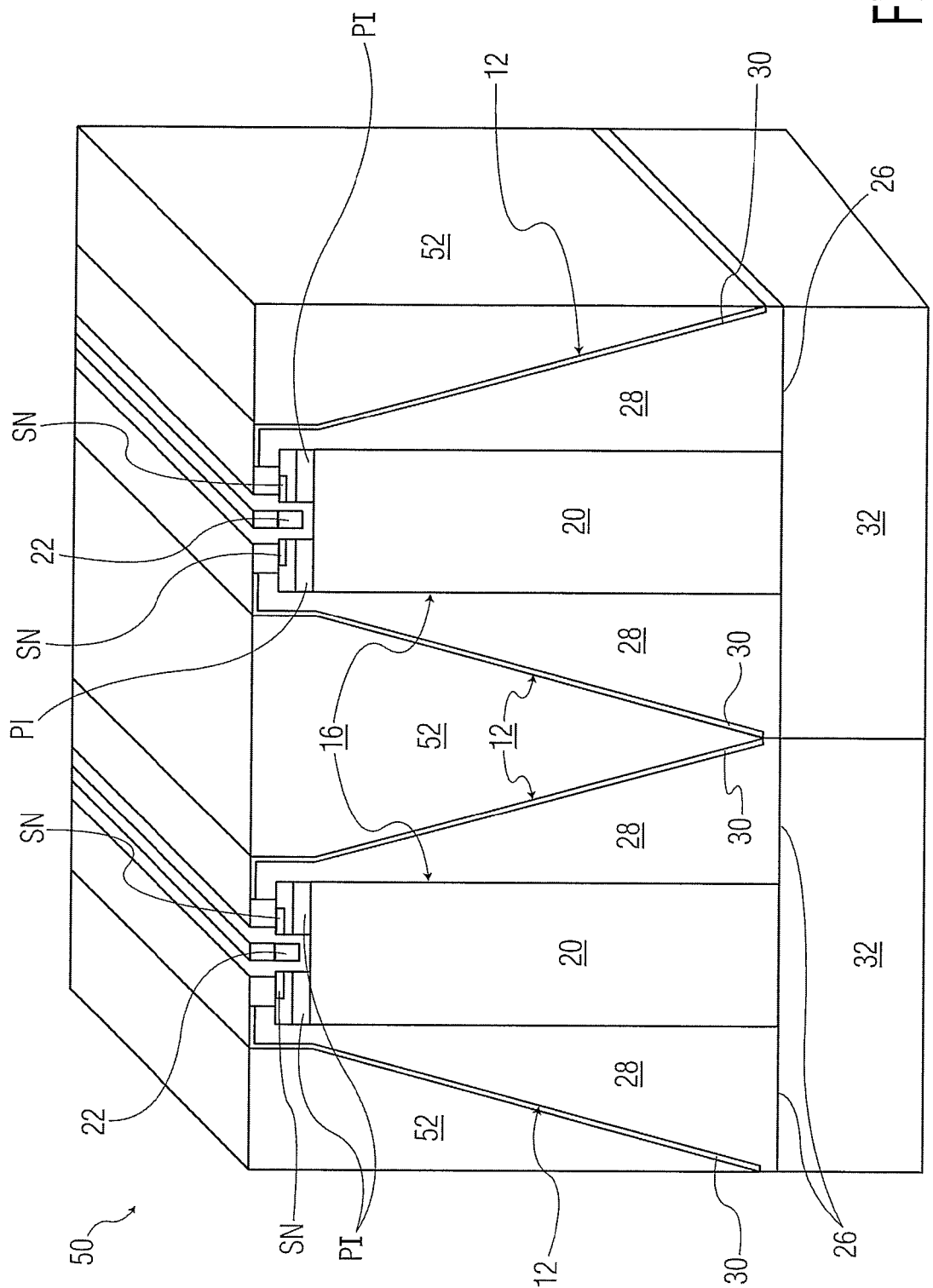
FIG. 3 is a three-dimensional cross-sectional view of the device of FIG. 1 according to another embodiment of the present invention.

The reduced-surface-field (resurf) device 10 can be fabricated in a vertical three-dimensional format by patterning long stripes in the plane of the silicon wafer surface by trench etching techniques. FIG. 2 shows a schematic cross-section of how such a layout 40 would look for the case of metal/conductor planarization process flow, while FIG. 3 shows a layout 50 for a dielectric planarized process flow. The only difference in these processes is that the area between the metal field plates 30 of adjacent unit cell devices is either metal/conductor or dielectric.

In the layout 40 illustrated in FIG. 2, the dielectric 28 is shaped such that its thickness varies linearly through the depth of the trenches 26. Metal field plates 30 are formed over the shaped dielectric 28, and are shorted to a corresponding source (SN). The areas of the trenches 26 located above and between the metal-dielectric field plate structures 12 are filled using a metal/conductor planarized process flow, in which a layer of metal/conductor 42 is formed and planarized. Although only a single recessed-gate structure 22 is shown formed in each silicon mesa 20, multiple recessed gate structures could also be fabricated in the cross-section of the silicon mesa 20 to improve gate conductance. In the layout 50 illustrated in FIG. 3, the layer of metal/conductor 42 has been replaced with a layer of dielectric 52. In both cases, the geometry of the trench stripe 16 as viewed from the surface must be a stripe for EQU. 1 to be valid; a linear dielectric thickness variation with position is only obtained for stripe geometry.

Figure 6:
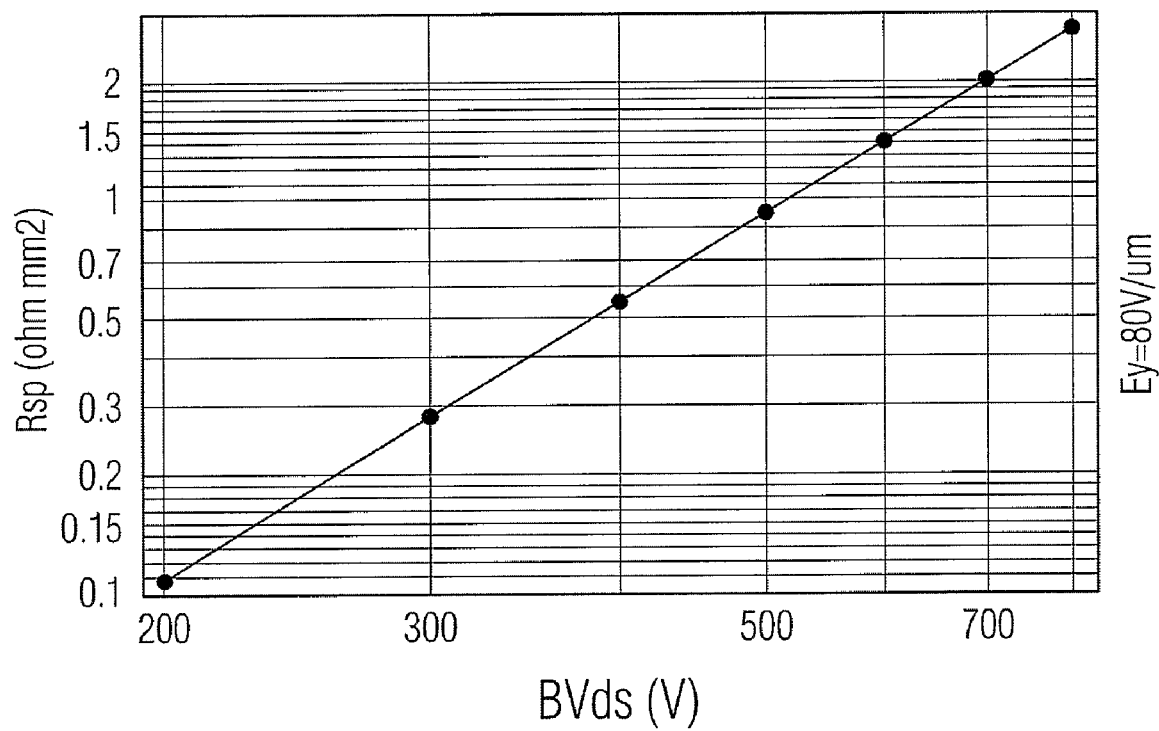
FIG. 6 illustrates a plot of Rsp versus BVds for ideal lateral SOCOS device.

The performance of these device structures has been determined from two and three-dimensional device simulation, with the design of the devices determined by analytical models for ionization integrals within the device structure. Table 1 contains specific on-resistance values as a function of the width of the silicon mesa 20 for a dielectric resurf device 10 in which the dielectric is silicon dioxide, and for a fixed drift region length (trench depth) $1_d$ of 50 µm. The $N_d * t_{soi}$ product was chosen based on solution of the transverse ionization integral such that the maximum integral value is 0.75. This leaves the horizontal to contribute 0.25 prior to BVds (Ix+Iy==1 at BV). Table 1 shows that for a 750V device, specific on-resistance figures-of-merit ($R_{sp-on}$) in the range of 0.4-1 ohm mm² are predicted. These values are the lowest known for this breakdown voltage range for any discrete silicon technology. Referring to FIG. 6, there is shown a plot of Rsp versus BVds for ideal lateral SOCOS device. At 700V, the ideal Rsp for a device with maximum transverse electric field of 80V/um and a longitudinal field of 15V/um is 2.0 ohm mm2.

TABLE 1

| $t_{soi}$ (µm) | $N_d$ (cm$^{-3}$) | $t_{ox}$ (µm) | $c_p$ (µm) | $R_{on}$ (ohm) | $R_{sp-on}$ (ohm-mm²) |
|---|---|---|---|---|---|
| 5 | $10^{16}$ | 6.5 | 18.0 | 53.2 | 0.96 |
| 2 | $3.1 \times 10^{16}$ | 5.2 | 12.4 | 50.8 | 0.63 |
| 1 | $7.6 \times 10^{16}$ | 4.2 | 9.4 | 52.1 | 0.49 |
| 0.5 | $2.0 \times 10^{16}$ | 3.3 | 7.1 | 56.5 | 0.40 |

Figure 4:
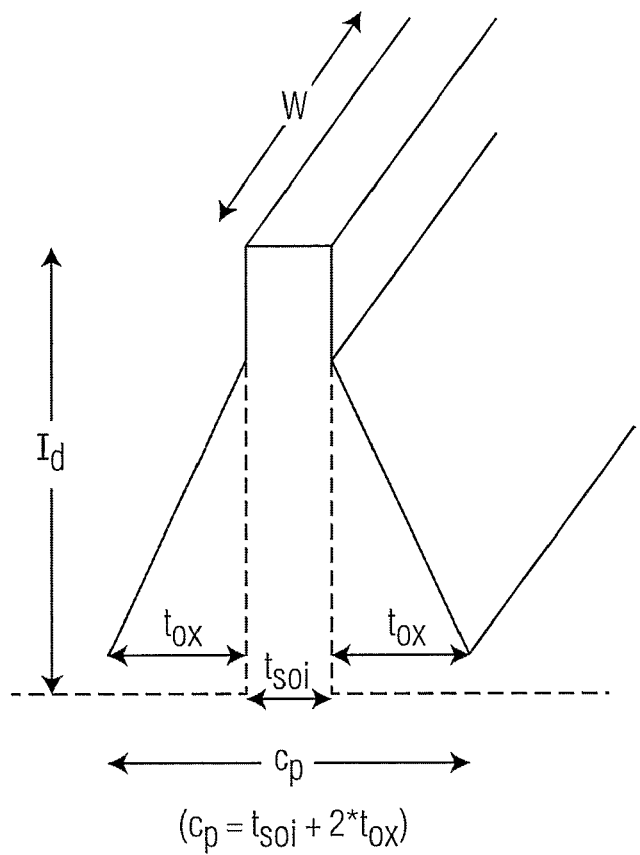
FIG. 4 illustrates the dimensions used to calculate the specific on-resistance of a device in accordance with the present invention.

Given the dimensions shown in FIG. 4, the on-resistance $R_{on}$ of the device 10 is given by:

$$R_{on} = (1_d/w) * (1/(q \mu N_d t_{soi})) \qquad \text{EQU. 2}$$

and the specific on-resistance Rsp-on is given by:

$$R_{sp-on} = R_{on} * c_p * w \qquad \text{EQU. 3}$$

where q is the magnitude of the electronic charge ($1.6 \times 10^{-19}$ coul), µ is electron mobility, and $N_d$ is the doping concentration within the drift region (silicon mesa 20). For constant doping and mobility, EQU. 3 can be rewritten as:

$$R_{sp-on} = \text{SheetResistance} * 1_d * c_p = (1_d * c_p)/(q \mu N_d t_{soi}) \qquad \text{EQU. 4}$$

Figure 5:
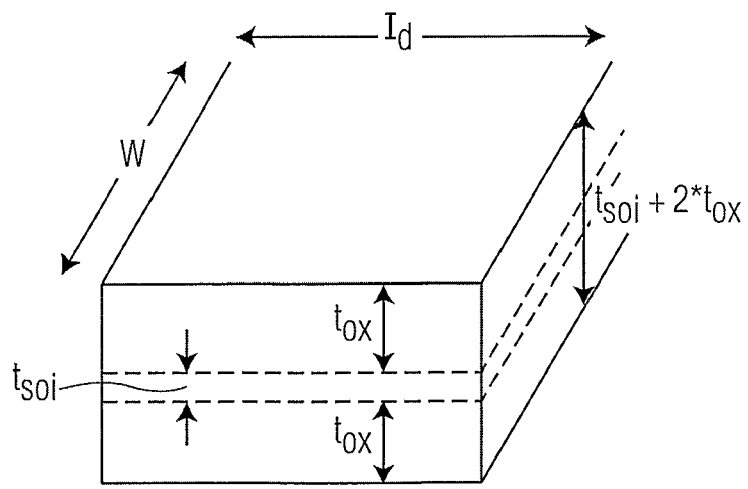
FIG. 5 illustrates the dimensions used to calculate the specific on-resistance of a device in accordance with the prior art.

Given the dimensions shown in FIG. 5, the resistance-width product of an ideal SOCOS device is given by:

$$R_{on-soc} * w = \int_0^{ld} \text{SheetResistance} \, dx \qquad \text{EQU. 5}$$

which is equal to:

$$R_{on\text{-}soc} * w = \int_0^{1d} 1/(q\mu(x)N_d(x)t_{soi})dx \qquad \text{EQU. 6}$$

The specific on-resistance $R_{sp\text{-}on\text{-}soc}$ is given by:

$$R_{sp\text{-}on\text{-}soc} = R_{on\text{-}soc} * \text{Area} \qquad \text{EQU. 7}$$

or $$R_{sp\text{-}on\text{-}soc} = \left(1/w \int_0^{1d} 1/(q\mu(x)N_d(x)t_{soi})dx\right) * 1_d * w \qquad \text{EQU. 8}$$

which is equal to:

$$R_{sp\text{-}on\text{-}soc} = \left(\int_0^{1d} 1/(q\mu(x)N_d(x)t_{soi})dx\right) * 1_d \qquad \text{EQU. 9}$$

It should be noted that there is a difference in the calculation of the on-resistance $R_{on\text{-}soc}$ for an ideal lateral SOCOS, as an integral of the sheet resistance has to be performed across the drift region of the device. This is due to the fact that the SOCOS structure has a doping profile which is not constant, with the doping linearly dependent on position. The mobility is not constant, because it is a function of doping. For the tapered device 10 of the present invention, both the mobility and the dopant are constant, so the sheet resistance can be expressed without an integral. It should also be noted that the above equations are dependent on the design values of maximum electric fields and ionization integrals, and are for illustration or rule-of-thumb type calculations.

To obtain the appropriate ratio of specific on resistance for a tapered dielectric device 10 in vertical format in accordance with the present invention to an ideal SOCOS in lateral format, the integral for the SheetResistance for SOCOS must be calculated. The materials parameters have been chosen so that the maximum transverse electric field is the same for both devices, as well as the maximum longitudinal electric field. By doing so, $R_{on\text{-}scc}*w = 6.239$ and $R_{on}*w = 4.506$. This means that the ratio of the specific on-resistance $R_{sp\text{-}on}$ of vertical tapered device 10 to the specific on-resistance $R_{sp\text{-}on\text{-}soc}$ of the lateral SOCOS becomes:

$$R_{sp\text{-}on}/R_{sp\text{-}on\text{-}soc} = 3c_p/41_d \qquad \text{EQU. 10}$$

Table 1 shows that the vertical implementation of a n-channel DMOS device 10 in accordance with the present invention has intrinsically a factor-of-five lower specific on-resistance than an ideal lateral SOCOS device structure (U.S. Pat. No. 6,310,378). To compare the Rsp for ideal lateral and tapered devices, a $t_{soi}$ was chosen for the taper which leaves room in the silicon mesa 20 for recess gate and source formation (e.g., in the 1-2 µm regime in Table 1), giving an Rsp between 0.49 and 0.63 ohm mm2. From the simple equations detailed above, an Rsp of around 0.37 ohm mm$^2$ is expected, in reasonable agreement with Table 1. It is also clear that as the mesa 20 width ($t_{soi}$) is shrunk, the simple equations (and simulations) show a factor of five reduction in Rsp can be expected for the tapered device. Based on the above simulations, therefore, it can be stated that simulations of the tapered cell 10 result in at most a factor-of-five reduction in Rsp at 700V with respect to ideal lateral SOCOS, in reasonable agreement with analytic calculations.

The n-type substrate 32 of FIGS. 1-3 can be replaced by a p-type substrate. Subsequent growth of an n-type epitaxial layer can be used to fabricate an IGBT. Table 2 compares simulated performance of tapered dielectric resurf DMOS and IGBTs, for a breakdown voltage of 630-730 V.

TABLE 2

| Device | $t_{soi}$ (µm) | $N_d$ (cm$^{-3}$) | $R_{on}$ (ohm) | $R_{sp\text{-}on}$ (ohm mm$^2$) | Isat (A/mm) |
|---|---|---|---|---|---|
| DMOS | 0.5 | $2.0 \times 10^{17}$ | 61.6 | 0.40 | 0.32 |
|  | 5.0 | $8.0 \times 10^{15}$ | 70.6 | 1.27 | 0.24 |
| IGBT | 0.5 | $2.0 \times 10^{17}$ | 117.8 | 0.79 | 0.82 |
|  | 5.0 | $8.0 \times 10^{15}$ | 19.3 | 0.35 | 1.09 |

For a 5 µm-wide silicon mesa, the IGBT gives a factor-of-three reduction in $R_{sp\text{-}on}$ with a factor-of-three increase in saturation current (Isat). Note that the volume concentration for the 5 µm silicon mesa was reduced from $1 \times 10^{16}$ to $8 \times 10^{15}$ cm$^{-3}$ (see Table 1). No parasitic thyristor latch is evident at room-temperature, i.e., saturation occurs before latch behavior.

The comparison of IGBT and DMOS results show that for fine geometries (thin silicon mesa widths) the DMOS has superior performance, while at thick silicon mesa widths the IGBT shows better performance. A plot of $R_{sp\text{-}on}$ versus silicon mesa width for a stripe geometry shows that mesa widths on the order of 3-5 µm are desirable, the charge levels are controllable, and the maximum transverse electric field can be maintained to a low level (<50V/µm) to improve stability. Mesa widths between 3-5 µm also leave sufficient silicon surface for formation of the recessed gate and the source connection contacts.

A preferred construction for the DMOS or IGBT is a stripe geometry of 3-5 µm-wide silicon mesa (stripes) with linearly tapered silicon dioxide sidewall dielectric layer of maximum thickness of 5.5-6.5 µm, constant doping in the silicon drift region of $3.5$-$1.0 \times 10^{16}$ cm$^{-3}$, all based on sub-critical transverse ionization integral value equal to 0.75.

It should also be noted that the saturation current of the IGBT is a factor-of-four higher than the DMOS of the same geometry. This is important for switch-mode power supply operation, where the forward voltage drop on the active switch is on the order of 8V. In this application, the Isat figure-of-merit is more important for cost analysis than $R_{sp\text{-}on}$.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

The invention claimed is:

1. A high-voltage device, comprising:
    a substrate;
    a silicon mesa formed on the substrate, wherein the silicon mesa provides a drift region having a constant doping profile;
    a recessed gate and source formed on the silicon mesa;
    a trench adjacent each side of the silicon mesa; and
    a metal-dielectric field plate structure formed in each trench;
    wherein each metal-dielectric field plate structure comprises a dielectric and a metal field plate formed over the dielectric, and wherein a thickness of the dielectric uniformly increases linearly through a portion of a depth of the trench, wherein the dielectric is configured to produce a constant longitudinal electric field through the portion of the depth of the trench.

2. The device of claim 1, wherein the silicon mesa comprises a stripe geometry.

3. The device of claim 1, wherein the thickness of the dielectric varies according to:

$$t_{ox}(x)=(E_x\in_0\in_{ox})/(qN_d t_{soi}))x+c,$$

where $E_x$ is longitudinal electric field, $\in_0$ is permittivity of free space, $\in_{ox}$ is permittivity of the dielectric, q is magnitude of electronic charge, $N_d$ is doping concentration in the drift region, $t_{soi}$ is thickness of the silicon mesa, and c is a constant related to gate oxide-field plate transition.

4. The device of claim 1, wherein the device comprises an re-channel double-diffused metal oxide semiconductor transistor.

5. The device of claim 1, wherein the device comprises an insulated gate bipolar transistor.

6. The device of claim 1, wherein the substrate and the silicon mesa are of the same doping type.

7. The device of claim 1, wherein the substrate and the silicon mesa are of different doping types.

8. The device of claim 1, wherein a dielectric layer is provided over the metal field plate in the trench, and wherein the thickness of the dielectric layer decreases through the depth of the trench.

9. The device of claim 1, wherein a metal/conductor layer is provided over the metal field plate in the trench, and wherein a thickness of the metal/conductor layer decreases through the depth of the trench.

10. The device of claim 1, wherein the silicon mesa has a width of 3-5 pm, wherein the dielectric of the metal-dielectric field plate structure has a maximum thickness of 5.5-6.5 pm, and wherein the constant doping in the silicon mesa is 1.0-3.5×10$^{16}$ cm$^{-3}$.

11. The device of claim 1, wherein a 750 V device has a specific on-resistance in the range of 0.4-10.0 ohm mm$^2$.

12. A high-voltage device comprising:
   a substrate;
   a silicon stripe formed on the substrate;
   a silicon mesa formed in the silicon stripe, wherein the silicon mesa provides a drift region having a constant doping profile;
   a recessed gate and source formed on the silicon mesa;
   a trench adjacent each side of the silicon stripe; and
   a metal-dielectric field plate structure formed in each trench along the silicon stripe;
   wherein each metal-dielectric field plate structure comprises a dielectric and a metal, field plate formed over the dielectric, and wherein a thickness of the dielectric uniformly increases linearly through a portion of a depth of the trench, wherein the dielectric is configured to produce a constant longitudinal electric field through the portion of the depth of the trench.

13. The device of claim 12, wherein the thickness of the dielectric varies according to:

$$t_{ox}(x)=(E_x\in_0\in_{ox})/(qN_d t_{soi}))x+c,$$

where $E_x$ is longitudinal electric field, $\in_0$ is permittivity of free space, $\in_{ox}$ is permittivity of the dielectric, q is magnitude of electronic charge, $N_d$ is doping concentration in the drift region, $t_{soi}$ is thickness of the silicon stripe, and c is a constant related to gate oxide-field plate transition.

14. The device of claim 12, wherein the device comprises an n-channel double diffused metal oxide semiconductor transistor.

15. The device of claim 12, wherein the device comprises an insulated gate bipolar transistor.

16. The device of claim 12, wherein the silicon stripe has a width of 3-5 pm, wherein the dielectric of metal-dielectric field plate structure has a maximum thickness of 5.5-6.5 pm, wherein the constant doping in the silicon mesa is 1.0-3.5×10$^{16}$ cm$^{-3}$.

17. The device of claim 12, wherein a 750 V device has a specific on-resistance in the range of 0.4-1.0 ohm mm$^2$.

18. A method for forming a high-voltage device, comprising:
   forming a silicon stripe on a substrate;
   forming a silicon mesa in the silicon stripe, wherein the silicon mesa provides a drift region having a constant doping profile;
   forming a recessed gate and source on the silicon mesa;
   forming a trench adjacent each side of the silicon stripe; and
   forming a metal-dielectric field plate structure in each trench along the silicon stripe;
   wherein each metal-dielectric field plate structure comprises a dielectric and a metal field plate formed over the dielectric, and wherein a thickness of the dielectric uniformly increases linearly through a portion of a depth of the trench, wherein the dielectric is configured to produce a constant longitudinal electric field through the portion of the depth of the trench.

19. The method of claim 18, further comprising:
   forming a dielectric layer or a metal/conductor layer over the metal field plate in the trench, wherein a thickness of the dielectric layer or a thickness of the metal/conductor layer decreases through the depth of the trench.

20. The method of claim 18, wherein the device comprises an n-channel double diffused metal oxide semiconductor transistor or an insulated gate bipolar transistor.

* * * * *